(12) United States Patent
Liu et al.

(10) Patent No.: US 6,618,230 B2
(45) Date of Patent: Sep. 9, 2003

(54) ELECTROSTATIC DISCHARGE CELL OF INTEGRATED CIRCUIT

(75) Inventors: Meng Huaug Liu, Hsinchu (TW); Chun-Hsiang Lai, Taichung (TW); Sing Su, Banchiau (TW); Tao Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/909,946

(22) Filed: Jul. 23, 2001

(65) Prior Publication Data

US 2003/0016478 A1 Jan. 23, 2003

(51) Int. Cl.[7] .................................................. H02H 9/00
(52) U.S. Cl. ...................................................... 361/56
(58) Field of Search ........................ 361/56, 91.7, 91.1; 307/86

(56) References Cited

U.S. PATENT DOCUMENTS

| | | | | |
|---|---|---|---|---|
| 5,610,791 A | * | 3/1997 | Voldman | 361/56 |
| 5,946,177 A | * | 8/1999 | Miller et al. | 361/56 |
| 6,118,323 A | * | 9/2000 | Chaine et al. | 327/333 |
| 6,118,640 A | * | 9/2000 | Kwong | 361/56 |

* cited by examiner

Primary Examiner—Gregory J. Toatley, Jr.
Assistant Examiner—Z Kitov
(74) Attorney, Agent, or Firm—Rosenberg, Klein & Lee

(57) ABSTRACT

The present invention provides an IC ESD cell, which is applicable to multiple-power-input and mixed-voltage ICs and capable of maintaining power sequence independence of each power source. The ESD cell of the present invention comprises a voltage selector circuit, which connects two separate power sources to select the one having a higher potential as the output voltage. An NMOS is used to connect the two separate power sources. An RC circuit is connected to an output of the voltage selector circuit to distinguish ESD event from normal power source. Therefore, the channel of the NMOS will be conducted to let the ESD current be led out via a designed path, hence preventing internal circuits of an IC from damage and accomplishing the object of whole chip protection.

10 Claims, 6 Drawing Sheets

US 6,618,230 B2

ELECTROSTATIC DISCHARGE CELL OF INTEGRATED CIRCUIT

FIELD OF THE INVENTION

The present invention relates to an electrostatic discharge (ESD) cell and, more particularly, to an ESD cell applicable to multiple-power-input and mixed-voltage integrated circuits (ICs) and capable of maintaining power sequence independence of each power supply.

BACKGROUND OF THE INVENTION

The technique of ESD cell is well known to those of ordinary skill in the art. For instance, in a conventional method of providing ESD protection, a circuit is provided in the device to guide ESD of potential danger to a ground end, and is kept away from operating devices in the circuit during ESD event.

Generally speaking, a power source required by a chip is separately provided to avoid noise coupling between bus pins thereof. However, this way of providing a separate power source will cause the problem of ESD. As shown in FIG. 1, a power source $V_{cco}$ of an I/O pin 10 is separated from a power source $V_{cci}$ connected to an internal circuit 12, and a GND bus thereof is also separated. A resistance $R_{sub}$ exists between a ground end of pin, $V_{sso}$, and a ground end of internal circuit, $V_{ssi}$. When an ESD pulse is inputted to the pin 10, the pulse current will be discharged via a path 1 shown in the figure with respect to the ground end $V_{ssi}$, and this path 1 is the preferable discharge path. However, the resistance of the resistor $R_{sub}$ between the ground end $V_{ssi}$ and the ground end $V_{sso}$ may be too large so that a too large voltage drop is generated between the two ground ends when the pulse current flows through, resulting in a too large voltage difference between the pin 10 and the $V_{ssi}$. If this voltage difference is too large, a path 2 shown in FIG. 1 will start being conducted to perform ESD, hence damaging some devices of the internal circuit 12 due to high voltage discharge.

On the other hand, if there is an ESD cell 16 between the power sources $V_{cci}$ and $V_{cco}$, as shown in FIG. 2, the ESD current will easily flow through a diode D1 and the ESD cell 16 and then reach the power source $V_{ccl}$, triggering a ESD power clamp 14 between the power source $V_{ccl}$ and the ground end $V_{ssi}$, as a path 3 shown in the figure. Additionally, if there is another ESD cell 18 connected between the ground ends $V_{sso}$ and $V_{ssi}$, the ESD current will more efficiently flow out from the ground end $V_{ssi}$ via a path 4 shown in the figure. The internal circuit 12 thus will not be overloaded by the ESD current and is protected by the ESD cells 16 and 18. Therefore, ESD cells between different input power sources are very important to protect the internal circuit.

In the prior art, back-to-back diodes or diode-connected devices are usually used as an ESD cell for providing the above function. As shown in FIGS. 3 and 4, the number of diodes in these two kinds of ESD cells depends on the requirement of noise resistance or the voltage difference between different power sources at two ends of the circuit. As shown in FIG. 3, if the voltages of a rated power source $V_{cc1}$ and a power source $V_{cc2}$ are the same and the power source $V_{cc1}$ endures higher noise, the number of diodes from the power source $V_{cc1}$ to the power source $V_{cc2}$ needs to relatively increase to enhance the capability of noise resistance. However, the increase of the number of diodes will relatively reduce the protection benefit of this ESD cell. As shown in FIG. 4, if the voltage of the power source $V_{cc1}$ is larger than that of the power source $V_{cc2}$, diode-connected dervices between them needs to generate a voltage difference from the power source $V_{cc1}$ to the power source $V_{cc2}$ larger than the voltage difference between the two power sources to compensate the voltage difference in between, thereby avoiding undesirable load effect between the two power sources.

Exactly as said above, in order to avoid noise interference between pins of different power sources, a considerable number of diodes are used in the above ESD cells, relatively reducing the benefit of the cells. Additionally, these kinds of ESD modules will let power sources at two ends have a sequentially dependent characteristic, which has potential problems in circuit design. Moreover, because the functions of present ICs tend to be diversified, many different power sources are required to provide a separate power source for each individual internal circuit. In order to save power dissipation, each individual internal circuit can be independently activated or deactivated according to dynamic operational requirement. Such a sequential characteristic of power supply will easily cause problems in circuit design when using the above back-to-back diodes type ESD cell.

As shown in FIG. 2, in a power-saving mode, if the power source $V_{cci}$ is deactivated, electric energy supplied by the power source $V_{cco}$ will flow to the deactivated power source $V_{cci}$ via the ESD cell, letting the power source $V_{cci}$ start providing electric energy undesirably. Therefore, if the sequence of power supply between different power sources is improperly designed, the object of power saving cannot be achieved, and the situation of short circuit will also arise due to injection of current.

Accordingly, using back-to-back diodes or diode-connected devices as an ESD cell in the prior art has problems when the voltages of power sources are different, and has the problem of noise interference when the voltages thereof are the same. Moreover, the requirement of sequence independence of power sources cannot be met. In other words, when two power input pins of a chip require two different voltages, or the degrees of noise endurance are different, the number of diodes of the module needs to be modified, reducing the benefit of this ESD cell. In consideration of these problems, the present invention proposes an ESD cell applicable to multiple input sides of power sources so that current will not be drained from an activated input power source to a deactivated input power source no matter what the sequence of the input power sources is.

SUMMARY OF THE INVENTION

In consideration of the above problems in the prior art ESD cell, the primary object of the present invention is to provide an ESD cell applicable to multiple-power-input and mixed-voltage ICs and capable of maintaining power sequence independence of each power source, thereby achieving the object of whole chip protection.

Another object of the present invention is to provide an ESD cell to effectively isolate noise interference at two ends of a power supply and not to reduce its benefit of ESD protection, hence effectively resolving the drawbacks of the prior art ESD cell.

To achieve the above objects, an ESD cell of the present invention is formed of a voltage selector circuit, a RC circuit, and an N-type metal oxide semiconductor (NMOS). Two separate power source pins connected to the NMOS can conduct the channel thereof to connect the two separate power sources to lead out the ESD current along a designed path when enduring an ESD pulse, hence avoiding damage to internal circuits. The channel of the NMOS is conducted and keeps open circuit to really isolate the two power sources under normal operation.

The various objects and advantages of the present invention will be more readily understood from the following detailed description when read in conjunction with the appended drawings, in which:

DETAILED DESCRIPTION OF THE PREFERRED EMBODIMENTS

The present invention primarily proposes an ESD cell applicable to multiple-power-input and mixed-voltage integrated circuits (ICs) and capable of maintaining power sequence independence of each power supply.

Figure 5:
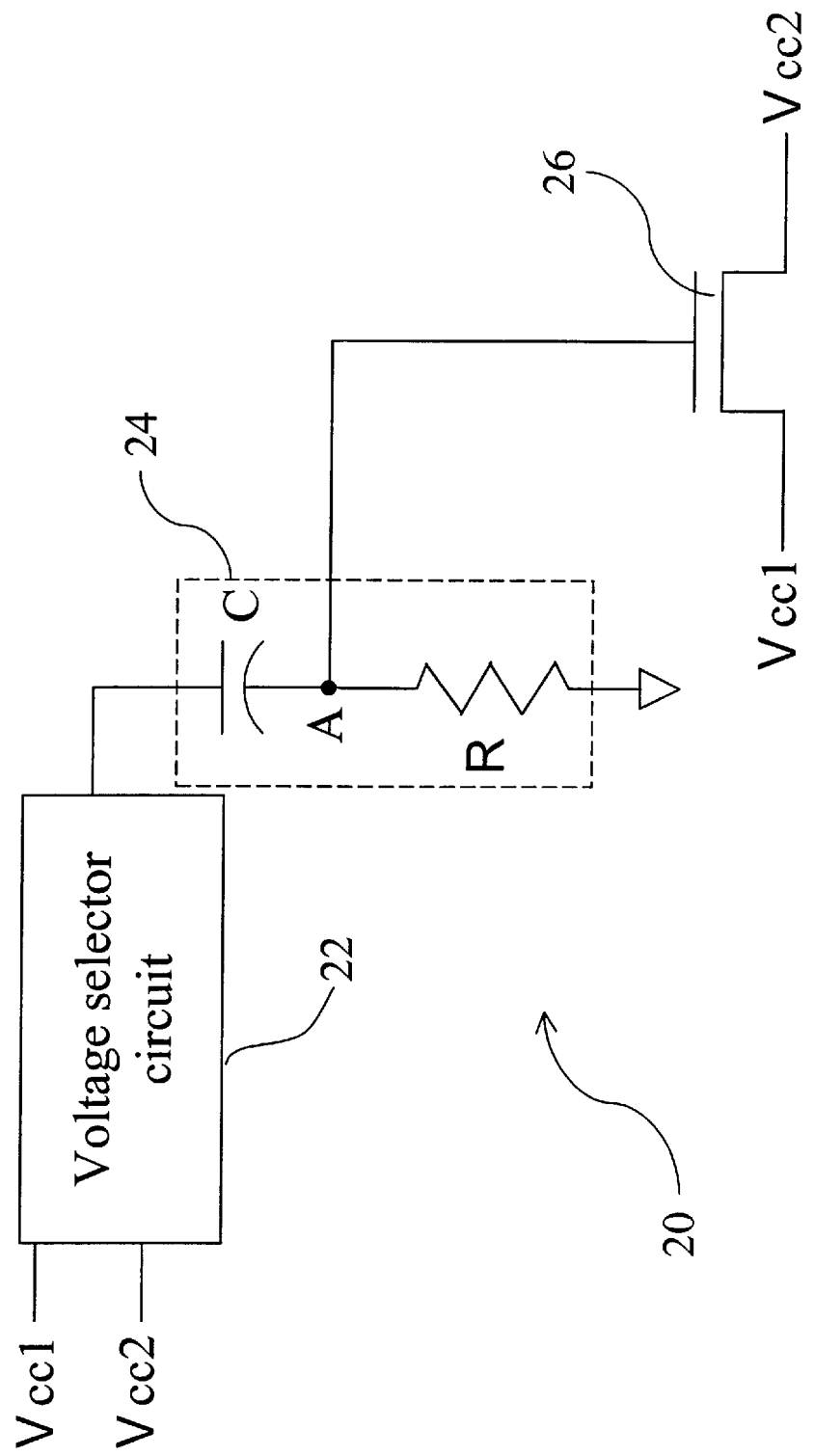
FIG. 5 is a circuit diagram of the present invention.

As shown in FIG. 5, An ESD cell 20 comprises a voltage selector circuit 22, which connects two separate power sources $V_{cc1}$ and $V_{cc2}$, and selects the one having a higher potential as the output. In other words, when $V_{cc1}$ is larger than $V_{cc2}$, the output of the voltage selector circuit 22 is the power source $V_{cc1}$, and vice versa. Additionally, An RC circuit 24 is connected to an output end of the voltage selector circuit 22 to distinguish ESD event and normal power-on action of power source. When there is an ESD event, the rise time of the ESD pulse is about of the order of nanosecond. The rise time of normal power-on action of power source is about of the order of millisecond. To distinguish them, the time constant of the RC circuit is chosen to be of the order of microsecond (about 0.1~10 microseconds). The drain and the source of an NMOS 26 are used to connect the two separate power source $V_{cc1}$ and $V_{cc2}$. The gate of NMOS 26 is also connected to the RC circuit 24, which is used to conduct the channel of the NMOS 26. Under normal operation, the NMOS 26 is usually not conducted. But when there is an ESD pulse generated, the NMOS 26 is turned on by the RC circuit 24 to conduct, providing a discharge current path. Therefore, no matter from which of the separate power sources the NMOS 26 receives the ESD pulse, the NMOS 26 is conducted, i.e., it is bi-directional.

The operation of the above ESD cell can be divided into two situations: normal operation and ESD event. The operational principle of the present invention will be illustrated by describing these two situations with simultaneous reference to the circuit shown in FIG. 5.

1. Normal Operation:

Under normal operation, no matter what the output of the voltage selector circuit 22 is, the potential of the node A of the RC circuit 24 will be zero. Because the rise time of the power-on action (of the order of millisecond) is much larger than the time constant of the RC circuit, the potential of the node A will quickly decrease to zero, having no opportunity of conducting the channel of the NMOS 26. The two ends of the NMOS 26 will thus be open-circuited. Therefore, under normal operation, no matter the $V_{cc1}$ is larger than the $V_{cc2}$ or vice versa, or the $V_{cc1}$ or $V_{cc2}$ is individually turned off to save power, the power sources $V_{cc1}$ and $V_{cc2}$ at the two ends of the NMOS 26 will be effectively isolated, hence accomplishing the object of power sequence independence between the two power sources. The operations of the two power sources will not affect each other, and noise will not easily flow through the ESD cell between them to interfere mutually.

2. ESD Event:

Assume the power source $V_{cc1}$ is used as the the power supply source of the I/O pin, and is subject to an ESD pulse to discharge with respect to the power source $V_{cc2}$. Under this situation, it is usually desirable to design a path letting the ESD current flow through the ESD cell between the two power sources $V_{cc1}$ and $V_{cc2}$ for discharge, as the path 3 shown in FIG. 2. Please also refer to FIG. 2 simultaneously. When the I/O pin 10 is subject to an ESD pulse voltage, the ESD current will pass the diode D1 to charge the power source $V_{cc0}$ to a high potential. If the ESD cell 20 of the present invention is used as the ESD cell 16 in FIG. 2, and the power sources $V_{cc1}$ and $V_{cc2}$ are used as the inputs of the voltage selector circuit 22, because the power source $V_{cc1}$ is charged to a high potential via the diode D1, and the rise of the ESD pulse is fast, the node A of the RC circuit 24 will not have enough time to discharge to ground. Therefore, the node A will be of high potential during an ESD event. This result will let the gate of the NMOS 26 be of a high potential, hence conducting the channel to let the ESD current flow from the power source $V_{cc1}$ via the channel to the power source $V_{cc2}$.

In addition, assume the power source $V_{cc2}$ is used as the I/O pin of the power supply source, and is subject to an ESD pulse to discharge with respect to the power source $V_{cc1}$. Under this situation, it is usually desirable to design a path letting the ESD current flow through the ESD cell between the two power sources $V_{cc1}$ and $V_{cc2}$ for discharge. When the I/O pin 10 is subject to an ESD pulse voltage, because the power source $V_{cc2}$ is charged to a high potential via the diode D1, and the rise of the ESD pulse is fast, the node A of the RC circuit 24 will not have enough time to discharge to ground. Therefore, the node A will be of a high potential during an ESD event. This result will let the gate of the NMOS 26 be of a high potential, hence conducting the channel to let the ESD current flow from the power source $V_{cc2}$ via the channel to the power source $V_{cc1}$.

Accordingly, no matter what the situation is, only an NMOS is required for the circuit of the present invention to achieve the object of discharging an ESD cell.

Figure 1:
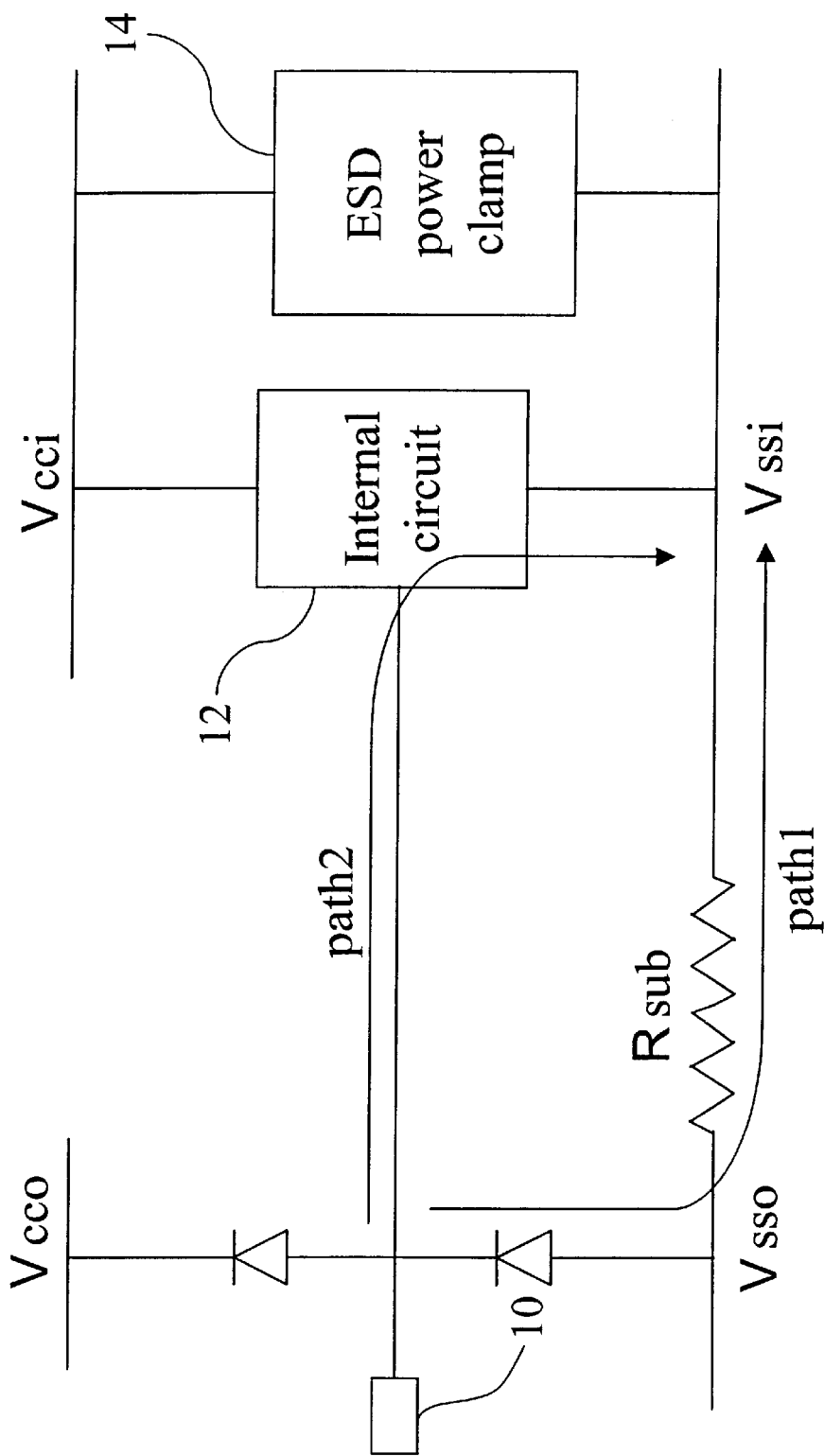
FIG. 1 is a diagram of a semiconductor circuit having separate power sources.
Figure 2:
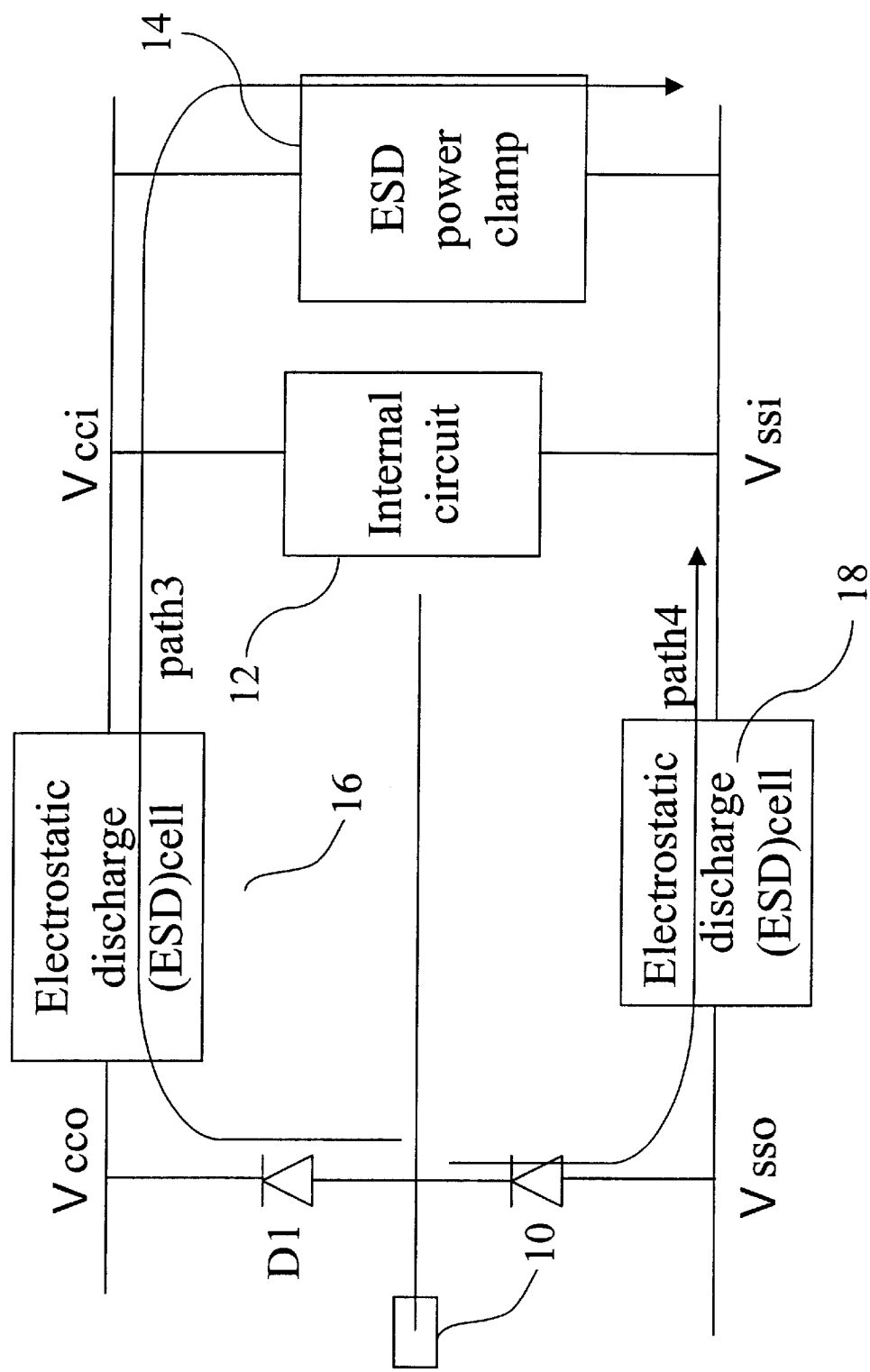
FIG. 2 is a diagram of the semiconductor circuit shown in FIG. 1 with an attached ESD cell.
Figure 3:
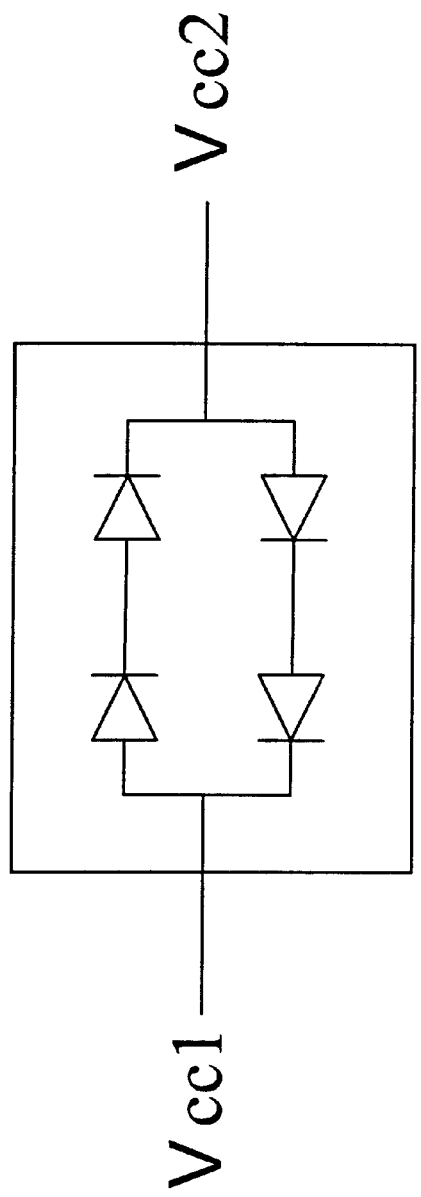
FIG. 3 is a circuit diagram of back-to-back diodes used as an ESD cell in the prior art.
Figure 4:
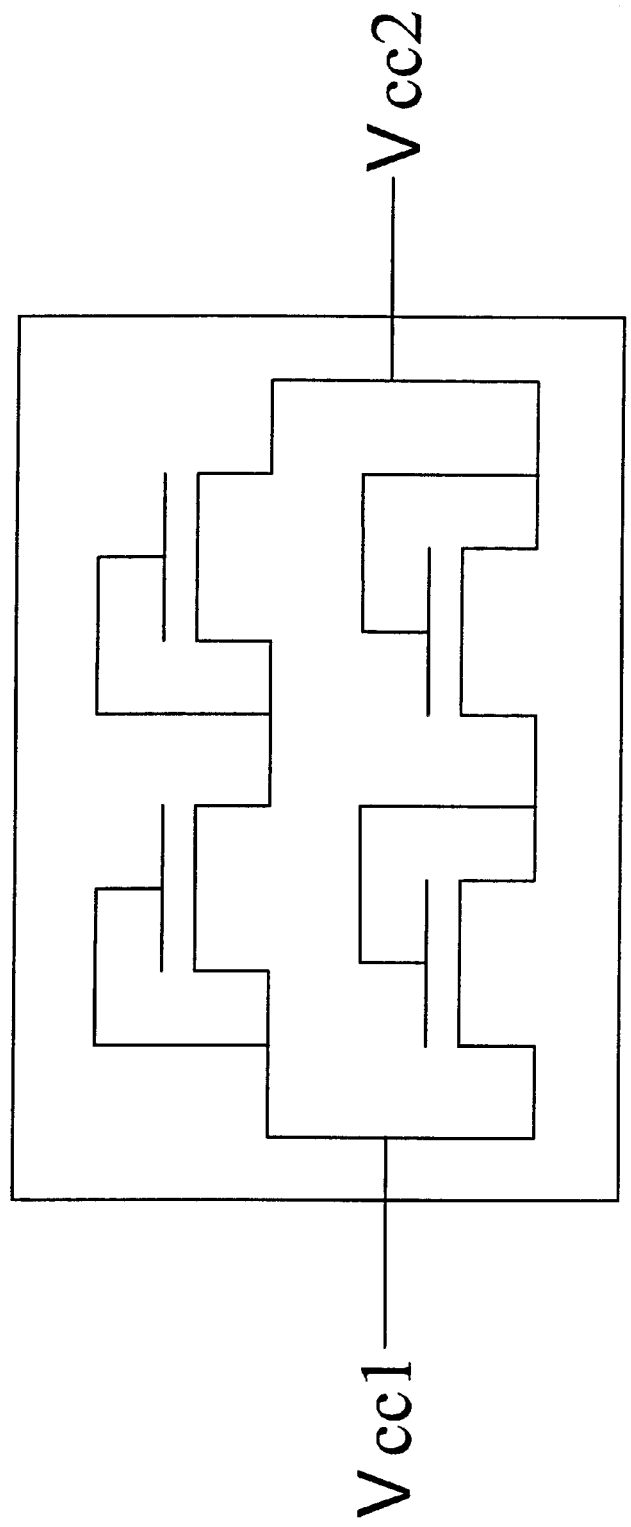
FIG. 4 is a circuit diagram of diode-connected devices used as an ESD cell in the prior art.

Moreover, the ESD cell of the present invention can also apply to a GND bus, wherein a drain and a source of an NMOS are connected to two ground ends $V_{ss1}$ and $V_{ss2}$, respectively, but the two inputs of the voltage selector circuit are selectively connected to two corresponding voltage power sources $V_{cc1}$ and $V_{cc2}$. When an ESD event occurs, the path ESD path 4 shown in FIG. 2 is provided to protect internal circuits from influence or damage of the ESD current.

Figure 6:
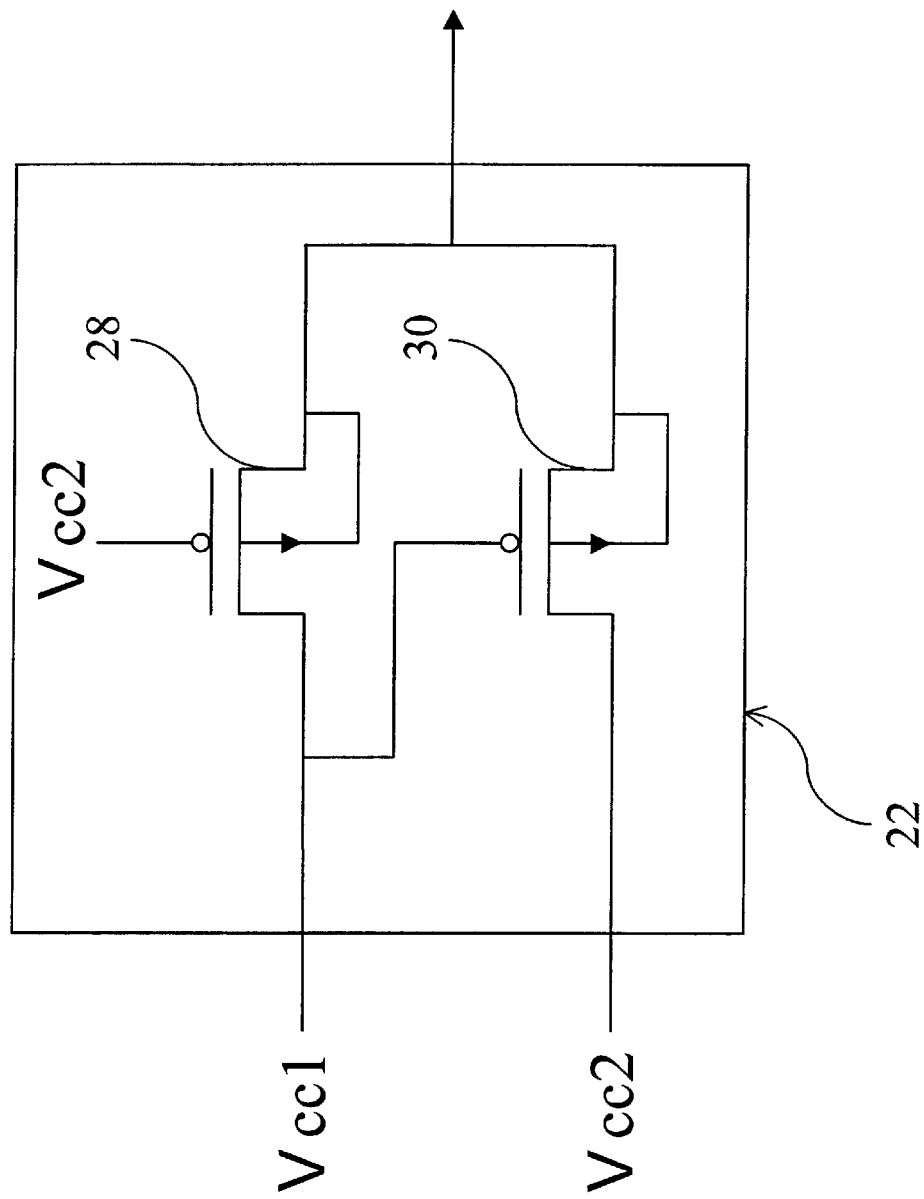
FIG. 6 is a circuit diagram of a voltage selector circuit of the present invention.

In the ESD cell of the present invention, the voltage selector circuit can be the one shown in FIG. 6. The voltage selector circuit 22 is composed of two PMOS transistors 28 and 30. The gate of the first PMOS transistor 28 is connected to the power source $V_{cc2}$, the source thereof is connected to the power source $V_{cc1}$ and the gate of the second PMOS transistor 30, the source of the second transistor PMOS is connected to the power source $V_{cc2}$, and the drains of the first and second PMOS transistors 28 and 30 are connected together to be used as the output of the voltage selector circuit 22. When the $V_{cc1}$ is larger than the $V_{cc2}$, the channel of the first PMOS transistor 28 will be conducted, and the second PMOS transistor 30 will be turned off so that the output of the voltage selector circuit 22 will be the $V_{cc1}$. Contrarily, when the $V_{cc2}$ is larger than the $V_{cc1}$, the channel of the second PMOS transistor 30 will be conducted, and the first PMOS transistor 28 will be turned off so that the output of the voltage selector circuit 22 will be the $V_{cc2}$.

The detailed structure of the voltage selector circuit 22 is not the key to the present invention. The point of importance of the present invention is to utilize an ESD cell composed of a voltage selector circuit, an RC circuit, and an NMOS.

Therefore, the present invention can apply to multiple-power-input and mixed-voltage ICs, and can simultaneously maintain power sequence independence of each power source. Moreover, the ESD cell can effectively isolate noise interference between two ends of power source and prevent an ESD pulse from damaging internal circuits, thereby effectively resolve the drawbacks of the prior art ESD cell and accomplishing the object of whole chip protection.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. An electrostatic discharge protection cell for protecting multiple power input and mixed-voltage integrated circuits from damage by an electrostatic discharge event, the electrostatic discharge protection cell comprising:

a voltage selector circuit coupled to at least two separate power sources for selectively coupling an output terminal thereof to one of said separate power sources being at the highest electric potential;

an RC circuit characterized by a predetermined time constant and coupled to said output terminal of said voltage selector circuit, said RC circuit including an output node for providing a switch-driving signal upon detection of the electrostatic discharge event; and an MOS switch coupled to said output node of said RC circuit for shunting two of said at least two power sources responsive to said switch-driving signal.

2. The electrostatic discharge protection cell as recited in claim 1, wherein said MOS switch is an NMOS transistor.

3. The electrostatic discharge protection cell as recited in claim 2, wherein said two of said at least two power sources are coupled to source and drain terminals of said NMOS transistor, respectively, and said switch-driving signal is coupled to a gate terminal of said NMOS transistor.

4. The electrostatic discharge protection cell as recited in claim 1, wherein said predetermined time constant is between 0.1 microseconds and 10.0 microseconds.

5. The electrostatic discharge protection cell as recited in claim 1, wherein a capacitor of said RC circuit is coupled to said output terminal of said voltage selector circuit and a resistor of said RC circuit is coupled to ground potential, said output node of said RC circuit being coupled to both said capacitor and said resistor.

6. An electrostatic discharge protection cell for protecting multiple power input and mixed-voltage integrated circuits from damage by an electrostatic discharge event, the electrostatic discharge protection cell comprising:

a voltage selector circuit coupled to at least two separate power sources for selectively coupling an output terminal thereof to one of said separate power sources being at the highest electric potential;

an RC circuit characterized by a predetermined time constant and coupled to said output terminal of said voltage selector circuit, said RC circuit including an output node for providing a switch-driving signal upon detection of the electrostatic discharge event; and an MOS switch coupled to said output node of said RC circuit for shunting two mutually remote ends of a ground bus responsive to said switch-driving signal.

7. The electrostatic discharge protection cell as recited in claim 6, wherein said MOS switch is an NMOS transistor.

8. The electrostatic discharge protection cell as recited in claim 7, wherein said mutually remote ends of said ground bus are coupled to source and drain terminals of said NMOS transistor, respectively, and said switch-driving signal is coupled to a gate terminal of said NMOS transistor.

9. The electrostatic discharge protection cell as recited in claim 6, wherein said predetermined time constant is between 0.1 microseconds and 10.0 microseconds.

10. The electrostatic discharge protection cell as recited in claim 6, wherein a capacitor of said RC circuit is coupled to said output terminal of said voltage selector circuit and a resistor of said RC circuit is coupled to ground potential, said output node of said RC circuit being coupled to both said capacitor and said resistor.

* * * * *